United States Patent
Anagnostopoulos

[19]

[11] Patent Number: 5,825,840
[45] Date of Patent: Oct. 20, 1998

[54] INTERLINE SENSOR EMPLOYING PHOTOCAPACITOR GATE

[75] Inventor: Constantine N. Anagnostopoulos, Mendon, N.Y.

[73] Assignee: Eastman Kodak Company, Rochester, N.Y.

[21] Appl. No.: 636,434

[22] Filed: Apr. 23, 1996

[51] Int. Cl.$^6$ .................. G11C 19/28; H01L 27/148; H01L 29/768
[52] U.S. Cl. ................ 377/60; 257/222; 257/232; 257/247
[58] Field of Search ................. 257/222, 223, 257/232, 247; 377/60

[56] References Cited

U.S. PATENT DOCUMENTS

| | | | |
|---|---|---|---|
| 3,856,989 | 12/1974 | Weimer | 257/232 |
| 3,995,302 | 11/1976 | Amelio | 257/232 |
| 4,104,543 | 8/1978 | Maeding | 257/247 |
| 4,117,514 | 9/1978 | Terui et al. | 257/233 |
| 4,194,213 | 3/1980 | Kano et al. | 257/232 |
| 4,229,752 | 10/1980 | Hynecek | 357/24 |
| 4,732,868 | 3/1988 | Nichols | 437/29 |
| 4,814,844 | 3/1989 | Bluzer | 357/24 |
| 4,994,405 | 2/1991 | Jayakar | 257/247 |
| 5,210,049 | 5/1993 | Anagnostopoulos | 437/53 |
| 5,286,990 | 2/1994 | Hynecek | 257/247 |

*Primary Examiner*—Gene M. Munson
*Attorney, Agent, or Firm*—James D. Leimbach

[57] ABSTRACT

An interline sensor is constructed using photocapacitors. The vertical shift register of the interline sensor is operated in a uniphase mode, i.e., holding one of the two phase (Ø2) at a D.C. potential while fluctuating the other phase (Ø1) between a voltage that is sufficiently above and below that D.C. potential to facilitate transfer of charge from one phase to the next. The uniphase mode is facilitated by a single electrode that covers both the phase that is held at a constant D.C. potential and the photodetector having photocapacitor charges. The single electrode in the preferred embodiment is an indium tin oxide electrode. The charges are transferred from the photocapacitors to the vertical shift register by a third level clock into Ø1 adjacent the photodetectors.

It is also proposed that the same ITO electrode be utilized to for phase 2 of both the vertical and horizontal CCD shift registers. Furthermore, to avoid having to separate the ITO electrode into the photocapacitor gate and the phase 2 gate, it is proposed that no cut is made within the electrode and that the vertical register be operated in the uniphase mode. That is the ITO electrode is biased to voltage of about −5 volts. It is important that the photocapacitor accumulation potential be about −4 volts so that its surface remains accumulated at all times and thus the dark current remains low. The horizontal register can be operated in the standard two phase mode so that the electrical noise in the video signal is maintained at a low level.

12 Claims, 4 Drawing Sheets

INTERLINE SENSOR EMPLOYING PHOTOCAPACITOR GATE

FIELD OF INVENTION

The invention relates generally to the field of charge coupled devices, and more specifically, the invention relates to interline sensors having a photocapacitor in place of a pinned photodiode and an indium-tin-oxide electrode covering the photocapacitor.

BACKGROUND OF THE INVENTION

There are numerous devices within the prior art that describe uniphase and virtual phase. While uniphase devices within the prior art are very commonly referred to as virtual phase devices, there are basic differences in the two terms. Devices can meet the criteria both uniphase and virtual phases. The prior art device in U.S. Pat. No. 4,229,752 issued to Hynecek on Oct. 21, 1980 discloses a continuous conductive layer, such as tin oxide, to form the single-phase clock electrode as shown in FIG. 6e of that patent (Col. 6, lines 24–28). A smaller voltage swing is sufficient to cause propagation of the signal charge packets to successive cells (Col. 6, lines 37–39). The invention can be used in CCD imagers including linear shift registers (Col. 6, lines 25–65). However, these devices are not interline devices. Moreover, no technique is disclosed to provide an ITO electrode that is placed over both the photodetector elements as well as a portion of a shift register.

Another prior art device is described in U.S. Pat. No. 4,814,844 issued to Bluzer on Mar. 21, 1989, which describes split two-phase CCD clocking gates held at constant potential with a first phase clock signal and second phase clock signal being adjusted to move charge from beneath the first phase electrode to beneath the second phase electrode (Col. 5, lines 9–20). More than two clock gate phase, e.g., three, four, etc. may be utilized (Col. 5, lines 41–43). While virtual two-phase devices are described, no disclosure is made of employing a uniphase effect to transfer charge from the photodetector elements themselves. Furthermore, no disclosure is made of employing a photocapacitor as the photodetector element.

U.S. Pat. No. 4,732,868 issued to Nichols on Mar. 22, 1988, commonly assigned with the present invention, discloses a uniphase CCD employing a gate conductor of tin-doped indium oxide (Col. 4, lines 48–51). The CCD is used in imaging devices, such as the frame transfer type (Col. 4, lines 52–54). A gate electrode can be deposited over the gate oxide as seen in FIG. 7 (Col. 4, lines 44–45). However, Nichols, does not teach any usefulness of employing a photocapacitor as the photodetector element or for employing a contiguous ITO electrode over both the photodetector and the adjacent shift register.

Still another prior art device is discussed in U.S. Pat. No. 5,210,049 which issued to Anagnostopoulos on May 11, 1993, and commonly assigned with the present invention, discloses an image sensor having a charge-coupled device shift register and at least one photocapacitor (Col. 2, lines 28–30). However, a single electrode covering both a portion of the vertical shift register and the photodetector, as required for true two-phase operation, is not taught.

Furthermore, prior art devices employing pinned photodiode technology have disadvantages such as process complexity. While pinned photodiodes have advantages for dark current characteristics because the dark current is low because the surface states are passivated by the shallow boron implants. However, the very shallow, heavy boron implants that can not be annealed properly (thus producing defects) and parasitic barriers between the photodiode and the vertical shift register, again arising because of the high boron dose pinning layer.

Pinned photodiodes also have good blue light response. This is an advantage over photocapacitor technology employing polysilicon electrodes.

From the foregoing discussion it should be apparent that there is a need for an image sensor that provides a true uniphase mode of operation, including transfer of charge from the photodetector area to a phase of the vertical shift register and also teaches the use of a photocapacitor as the photodetector element.

SUMMARY OF THE INVENTION

The present invention is directed to overcoming one or more of the problems set forth above to provide true uniphase operation. In progressive scan interline sensors it is proposed that the photodiode be replaced by a photocapacitor with ITO gate electrode.

An interline sensor is constructed using photocapacitors. The vertical shift register of the interline sensor is operated in a uniphase mode, i.e., holding one of the two phases (Ø2) at a D.C. potential while fluctuating the other phase (Ø1) between a voltage that is sufficiently above and below that D.C. potential to facilitate transfer of charge from one phase to the next. The uniphase mode is facilitated by a single electrode that covers both the phase that is held at a constant D.C. potential and the photodetector having photocapacitor charges. The single electrode in the preferred embodiment is an indium tin oxide electrode. The charges are transferred from the photocapacitors to the vertical shift register by a third level clock into Ø1 adjacent the photodetectors.

It is also proposed that the same ITO electrode be utilized for phase 2 of both the vertical and horizontal CCD shift registers. Furthermore, to avoid having to separate the ITO electrode into the photocapacitor gate and the phase 2 gate, it is proposed that no cut is made within the electrode and that the vertical register be operated in the uniphase mode. That is the ITO electrode is biased to voltage of about −5 volts. It is important that the photocapacitor accumulation potential be about −4 volts so that its surface remains accumulated at all times and thus the dark current remains low. The horizontal register can be operated in the standard two phase mode so that the electrical noise in the video signal is maintained at a low level.

The above and other objects of the present invention will become more apparent when taken in conjunction with the following description and drawings wherein identical reference numerals have been used, where possible, to designate identical elements that are common to the figures which illustrate an interline sensor constructed to operate in a uniphase mode having at least one vertical shift register, the vertical shift registers being constructed as two-phase shift registers with a plurality of photodetectors adjacent each of the vertical shift registers, a barrier region between each photodetectors and its respective vertical shift register, single phase means for allowing the transfer of charge from the photodetectors to the vertical shift registers to operate in a uniphase mode by adjusting only one of the phases; and at least one horizontal shift register.

ADVANTAGEOUS EFFECT OF THE INVENTION

The present invention has the following advantages. It provides a reduction of dim point defects to a level seen in full frame ITO sensors. Further, it provides a reduction in the number of fabrication steps required and relaxes the process tolerances. An increased yield is seen as well as a process consolidation. These advantages are achieved with no resulting loss in quantum efficiency as compared to photodiode detectors including the blue region of the spectrum because of the usage of ITO electrodes.

DETAILED DESCRIPTION OF THE INVENTION

Figure 1A:
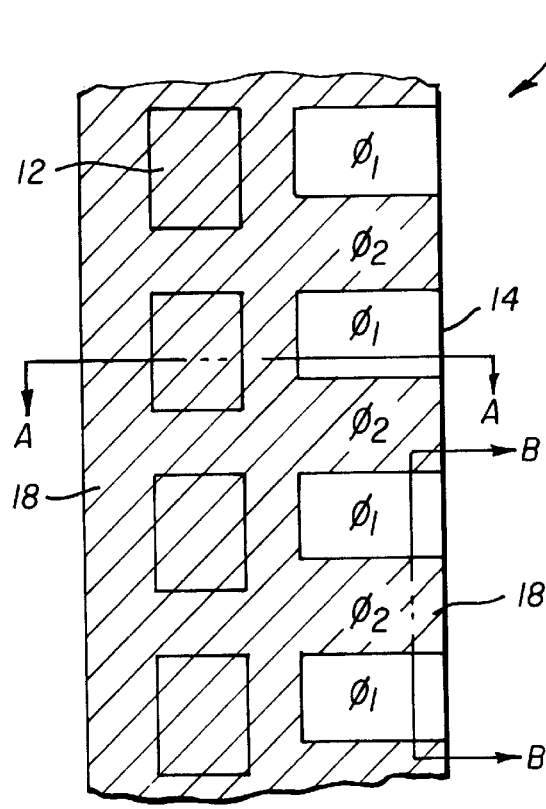
FIG. 1a is a diagram of an interline sensor constructed in accordance with the present invention such that the photodetectors are made using photocapacitors.
Figure 1B:
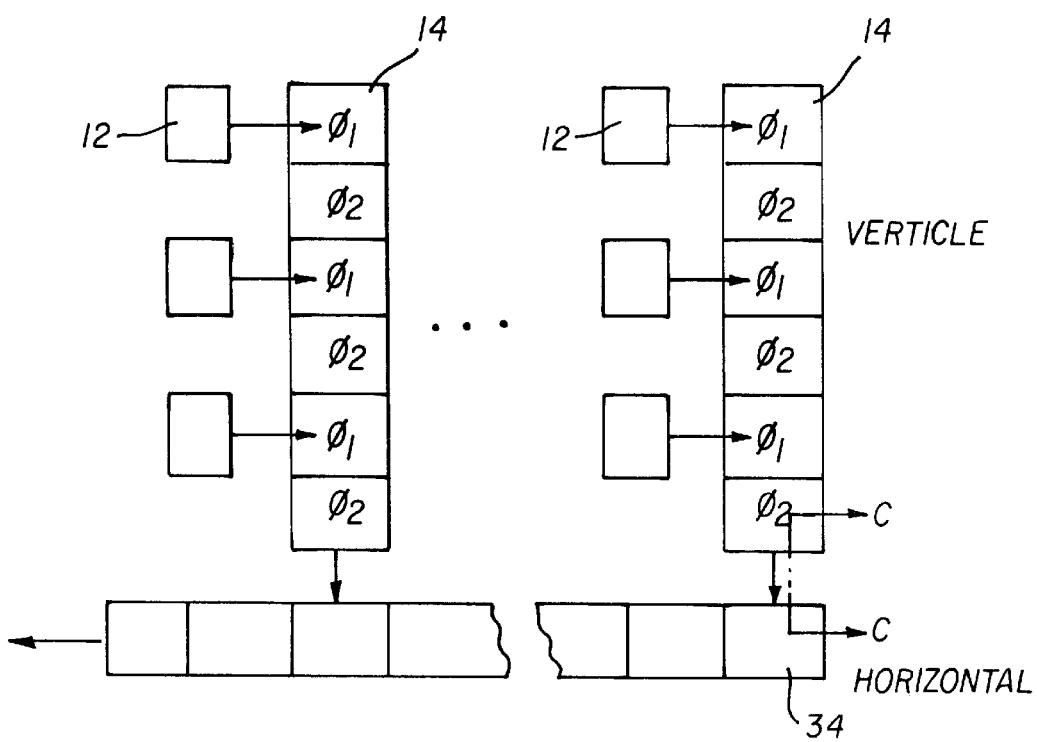
FIG. 1b is a diagram illustrating the interline sensor configuration that is employed by the present invention.
Figure 3:
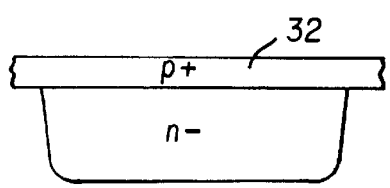
FIG. 3 is a pinned photodiode employed by the prior art as a photodetector.
Figure 2:
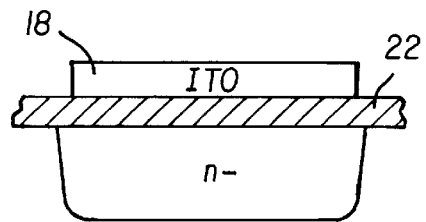
FIG. 2 is a diagram of a photocapacitor as envisioned by the present invention.

I have discovered that an interline sensor 10, as shown in FIG. 1a and FIG. 1b, can be constructed with photodetectors 12 made using a photocapacitor 22, as seen in FIG. 2. This differs from the pinned photodiode 32 employed by the prior art, as shown in FIG. 3. By employing a photocapacitor 22 in place of a pinned photodiode 32, the interline sensor 10 can then have the adjacent vertical shift register 14 operated in a uniphase mode, i.e. holding one of the two phases (Ø2 as shown FIG. 1) at a D.C. potential while fluctuating the other phase (Ø1 as shown in FIG. 1) between a voltage that is sufficiently above and below that D.C. potential to facilitate transfer of charge from one phase to the next. The present invention envisions that this transfer be accommodated by a single electrode material 18 that covers both the photodetectors 12 and the phase held at a constant potential (Ø2).

In the preferred embodiment an INDIUM-TIN-OXIDE (ITO) electrode material is employed as electrode 18 covering both the phase that is held at a constant D.C. potential and the photodetectors 12 which are photocapacitors 22. Charges are transferred from the photocapacitor 22 to the vertical shift register 14 by a third level clock into Ø1 adjacent the photodetectors 12.

Prior art devices employ as the photocapacitors (ITO electrode) in place of the pinned photodiode without the provision of a contiguous ITO electrode over the photodetector and any phase of the vertical shift register.

Uniphase devices are known as are virtual phase devices (Texas Instruments) that operate in a manner similar to a uniphase device. However, these devices are not interline devices and do not provide for the ITO electrode to be placed over both the photodetectors' elements as well as a portion of a shift register.

Figure 4A:
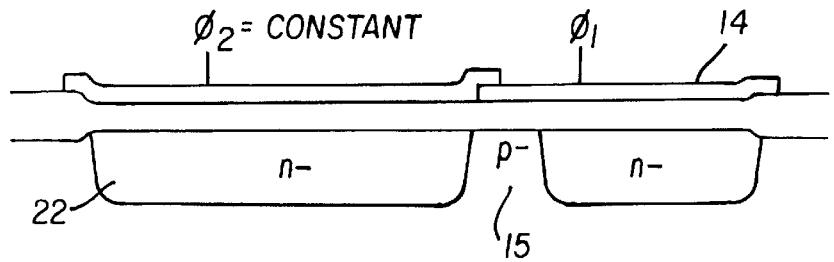
FIG. 4a is a cross sectional diagram taken along the line A—A of FIG. 1 through the photocapacitor and the Ø1 of the vertical shift register.
Figure 4B:
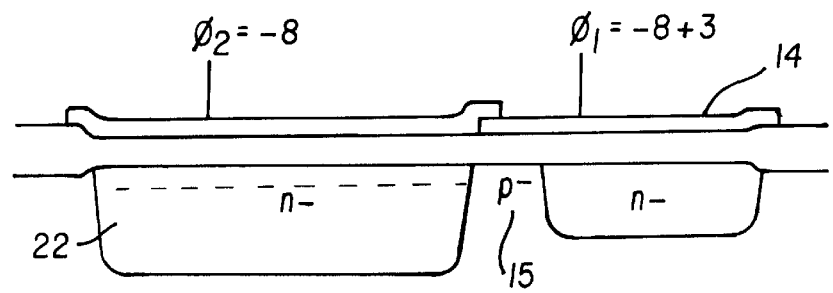
FIG. 4b is the cross sectional diagram of FIG. 4a where the potential levels of Ø1 and Ø2 are configured for integration mode.

Referring now to FIGS. 4a–4d, FIG. 4a is a cross sectional diagram taken along the line A—A of FIG. 1 with a corresponding potential diagram for Ø1 and the photocapacitor 22 operated under control of the Ø2 phase. Here, both the photocapacitor 22 and the Ø1 area of the vertical shift register 14 have n- area that are separated from each other by the barrier region 15 which is juxtapositioned beneath the edge of the Ø1 electrode. Barrier region 15 is a p- doped area that allows the present invention to operate in the context of the preferred embodiment as explained, herein. FIG. 4a illustrates a cross sectional view of the device as taken along the line AA of FIG. 1a. Referring to FIG. 4b, Ø2 is held at a constant potential of −8 volts and Ø1 is held at a level that does not overcome the potential barrier 15. This level can fluctuate within the preferred embodiment from +3 to −8 volts (a +7 volt is necessary to overcome barrier region 15). This allows barrier region 15 to provide separation between the photocapacitor 22 and the vertical shift register 14 as shown in FIG. 4a.

FIG. 4b is the cross sectional diagram of FIG. 4a where the levels of Ø1 and Ø2 both have a level −8 volts applied for operation in the integration mode. Here, barrier 15 still provides the separation potential between the photocapacitor region 22 beneath the Ø2 electrode and the Ø1 phase of the vertical shift register 14. Charge will accumulate in the photocapacitor region 22 for a predetermined periods of time until transfer to the vertical shift register.

Figure 4C:
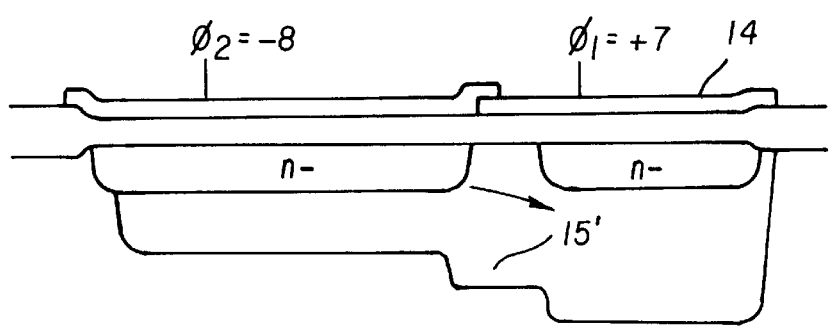
FIG. 4c is the cross sectional diagram of FIG. 4a where the potential levels of Ø1 and Ø2 are configured for transfer mode.
Figure 4D:
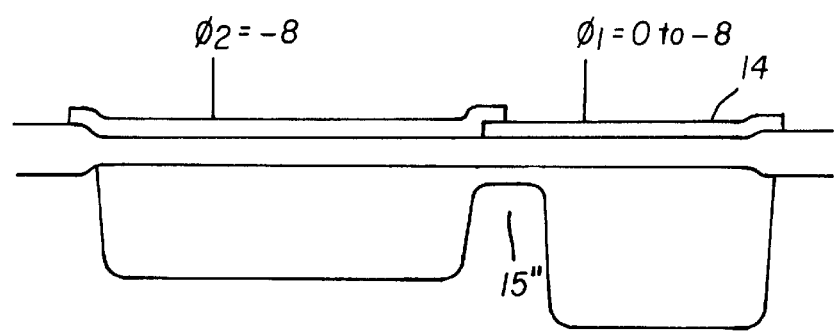
FIG. 4d is the cross sectional diagram of FIG. 4a where the potential levels of Ø1 and Ø2 are configured for clock out mode.

FIG. 4c illustrates the voltage levels of the Ø1 phase of the vertical shift register and the Ø2 electrode configured for transfer mode wherein charges stored within the photocapacitor 22 are transferred to the Ø1 phase of the vertical shift register 14. Here, while Ø2 remains at the integration mode level of −8 volts, the Ø1 phase is placed at a +7 volt level. This facilitates the transfer of charge from the area Ø2 beneath the photocapacitor 22, over the barrier potential 15', to the Ø1 phase of the vertical shift register 14.

Figure 5A:
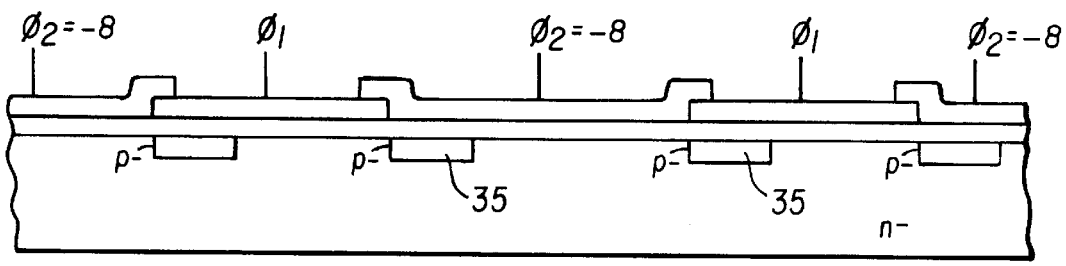
FIG. 5a is a cross sectional diagram taken along the line B—B of FIG. 1 where Ø1 and Ø2 are at a constant potential an associated potential diagram.

FIG. 5a is a cross sectional diagram of the vertical shift register 14 taken along the line B—B of FIG. 1. The cross sectional diagram shown in FIG. 5a both phases placed at the D.C. level, which is −8 volts. This equipotential on either side of barrier 35 prevents charge from transferring between the two phases.

Figure 5B:
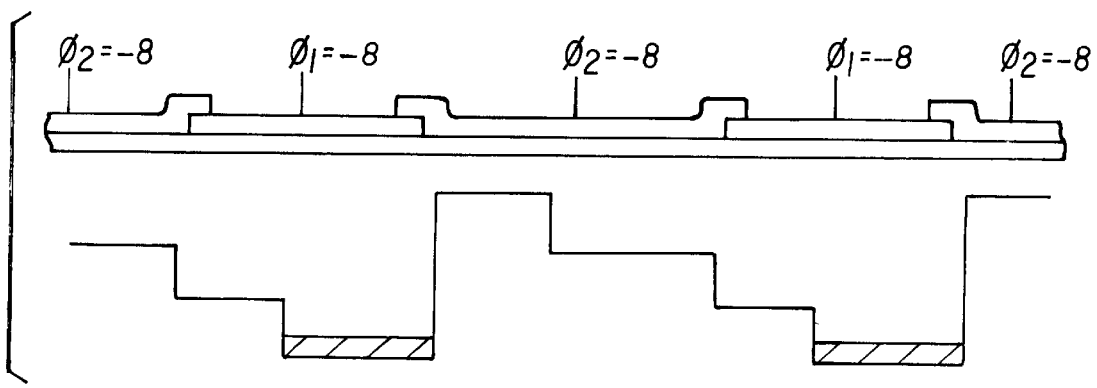
FIG. 5b is the cross sectional diagram of FIG. 5a where Ø1 and Ø2 are configured for transferring all charge within the photodiodes to Ø1 under application of a +7 volt third level clock.

FIG. 5b illustrates the transfer of charge within the photocapacitors to the Ø1 phase of the vertical shift register by the application of a third level clock, here seen at a +7 voltage level, to the Ø1 electrode. The effect of the third level clock is seen by referring to the potential diagram. Here, the potential well create by the third level clock is readily apparent, as it causes the charges beneath the of the photocapacitor (not shown) to step into the deeper potential well beneath the Ø1 electrode. The area beneath the vertical shift register Ø2 electrode remains at a level D.C. level of –8 volts that was used to transfer charge from the photocapacitor.

Figure 5C:
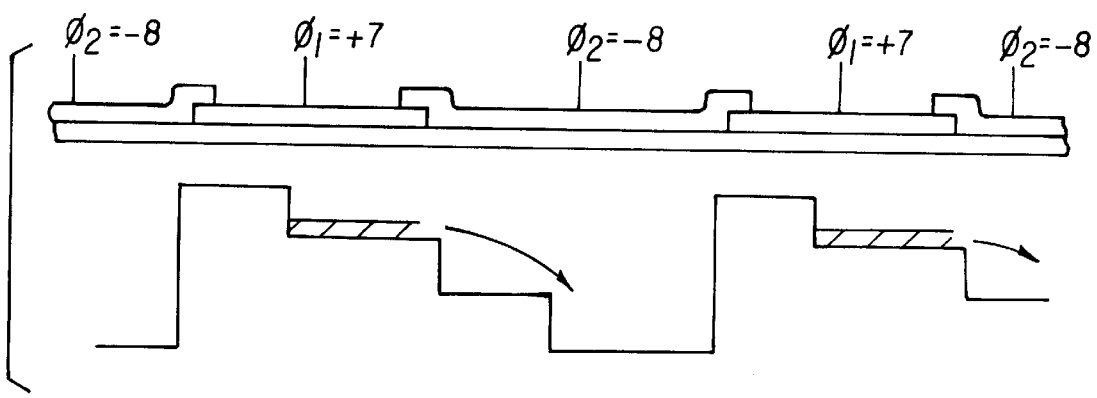
FIG. 5c is a cross sectional diagram of FIG. 5a where Ø1 and Ø2 are configured to transfer charge from beneath Ø1 to beneath Ø2.

FIG. 5c is the cross sectional diagram of FIG. 5a where Ø1 and Ø2 are configured to transfer charge through the vertical shift register. Here, the third level clock shown in FIG. 5b is removed and a –8 volt level is placed on the Ø1 electrode and the third level clock is placed on the $\Phi_2$ electrode. This allows the well beneath the Ø1 to collapse and the charges formerly in beneath the Ø1 electrode to fall to the area contained beneath the Ø2 electrode. Barrier 35 is a p- doped area that prevents the charge from traversing the vertical shift register 14 opposite the desired path. In this manner charge is moved down the vertical shift register 14 and into the horizontal shift register 34. The line contained within the vertical shift registers 14 is thereby, transferred out to the horizontal shift register.

Figure 5D:
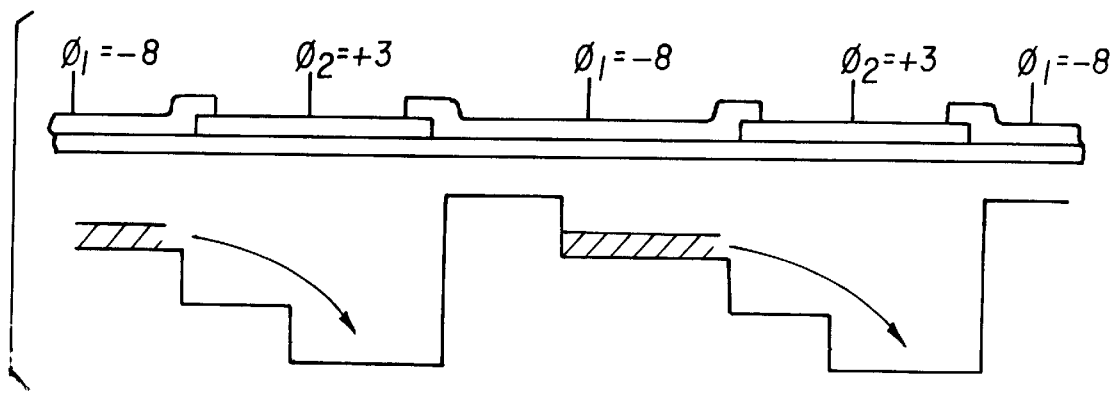
FIG. 5d is the cross sectional diagram of FIG. 5a where Ø1 and Ø2 are configured to transfer charge from beneath Ø2 to beneath Ø1.

FIG. 5d is the cross sectional diagram of FIG. 5a where the voltages applied to the Ø1 and Ø2 phases to allow transfer of charge through next phase of the vertical shift register. Ø1 is placed at a level of +3 volts while Ø2 remains at a –8 volt level resulting in a transfer of charge as indicated by the accompanying potential diagram. Taken in conjunction with FIG. 5c a transfer of charge through a complete stage of the vertical shift register has completed.

Figure 5E:
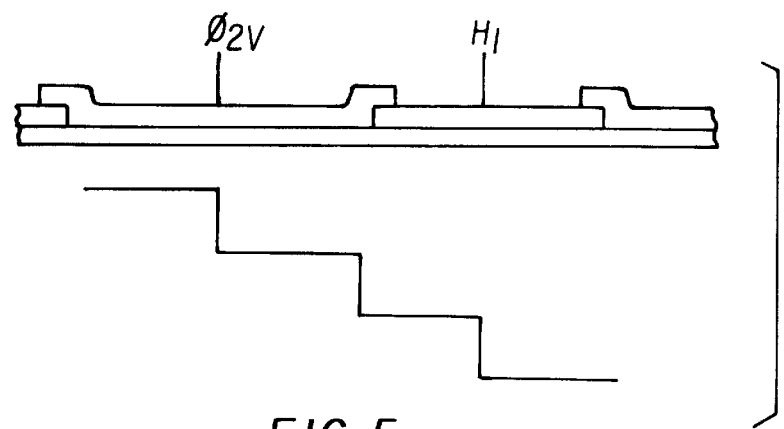
FIG. 5e is the cross sectional diagram of FIG. 1b along line VV where Ø2 and H1 are configured to transfer charge from the vertical shift register to the horizontal shift register with an associated potential diagram.

FIG. 5e is cross sectional diagram of FIG. 1b taken along the line CC to illustrate the transfer of charge from the vertical shift register to the horizontal shift register. The transfer from the vertical shift register to the horizontal shift register occurs from charge stored within the last Ø2 phase of the vertical shift register and is transferred to the Ø1 phase of the horizontal shift register.

There are limitations to the present invention. A resulting increase in CCD dark current occurs that can be eliminated by operating phase 2 in accumulation, i.e. clock phase 2 of the vertical shift register at between –10 and –5 volts.

It is also proposed that the same ITO electrode be utilized to for phase 2 of both the vertical and horizontal CCD shift registers. Furthermore, to avoid having to separate the ITO electrode into the photocapacitor gate and the phase 2 gate, it is proposed that no cut is made within the electrode and that the vertical register be operated in the uniphase mode. That is the ITO electrode is biased to voltage of about –5 volts. It is important that the photocapacitor surface also remains in accumulation at all times and thus the dark current remains low. The horizontal register can be operated in the standard two phase mode so that the electrical noise in the video signal is maintained at a low level.

It is also envisioned that the photocapacitor of the present invention be employed in multi-phase devices of two or more phases. In such an embodiment there would be an electrical separation (not shown) between the photocapacitor electrode and the electrodes of the vertical shift register. Also the vertical shift register could be operated in multiple phases. Such embodiments would comprises either polysilicon or ITO as photocapacitor elements. Using an ITO electrode would yield better response in the blue region of the spectrum. Whereas polysilicon is a more commonly used material due to being more compatible with silicon based devices.

The invention has been described with reference to a preferred embodiment. However, it will be appreciated that variations and modifications can be effected by a person of ordinary skill in the art without departing from the scope of the invention.

Parts List:
- 10 interline sensor
- 12 photodetectors
- 14 vertical shift register
- 15 p- barrier between photocapacitor and the vertical shift register
- 18 sidle electrode material
- 22 photocapacitor
- 32 photodiode
- 34 horizontal shift register
- 35 p- barrier in vertical shift register between phases

I claim:

1. An interline sensor constructed to operate in a uniphase mode comprising:
   at least one vertical shift register arranged as a two phase vertical shift register, the vertical shift register having means for applying a first potential level and a second potential level;
   a plurality of photodetectors adjacent the vertical shift register;
   a barrier region between each photodetector and the vertical shift register;
   single phase means for allowing the transfer of charge from the photodetectors to the vertical shift register in a uniphase mode by holding one of the two phases at a D.C. potential while fluctuating the other phase between a voltage that is sufficiently above and below that D.C. potential to facilitate transfer of charge from one phase to the next; and
   at least one horizontal shift register operatively coupled to receive charge from the vertical shift register.

2. The sensor of claim 1 wherein the single phase means further comprises means for transferring charge from the photodetectors to the vertical shift registers.

3. The sensor of claim 1 wherein the single phase means further comprises a single electrode over the photodetector and one of the phases of the vertical shift register.

4. The sensor of claim 3 wherein the single electrode is an Indium-Tin-Oxide (ITO) electrode.

5. The sensor of claim 4 wherein the ITO electrode has a first portion over the photodetector and a second portion over the one phase of the vertical shift register with first portion and the second portion formed by a single contiguous ITO layer.

6. The sensor of claim 5 wherein the single phase means further comprises an Indium-Tin-Oxide (ITO) electrode material covering both the phase that is held at a constant D.C. potential and the photodetector having photocapacitor charges.

7. The sensor of claim 1 further comprising means for transferring charge from the photodetectors to the vertical shift register by application of a third level clock.

8. The sensor of claim 1 wherein the horizontal shift register is also a two-phase device operated in a uniphase mode.

9. A method of performing charge transfer in a uniphase mode on a sensor having at least one vertical shift register that is configured as a two-phase device, a plurality of photodetectors comprising photocapacitors adjacent each of the vertical shift registers, and at least one horizontal shift register operatively coupled to receive charges from the vertical shift register and transfer it out of the sensor
   by placing on the sensor, single phase means that allow transfer of charge from the photodetectors to the vertical shift register and through the phases of the vertical shift register by adjusting only one of two phases comprising the step of:

holding one of the two phases (Ø2) at a D.C. potential while fluctuating the other phase (Ø1) between a first level clock and a second level clock voltage that is sufficient to facilitate transfer of charge between the phases of the vertical shift register.

10. The method of claim 9 wherein the step of placing further comprises placing an Indium-Tin-Oxide (ITO) electrode material over both the phase that is held at a constant D.C. potential and the photocapacitor.

11. The method of claim 10 wherein the step of placing further comprises placing the-Indium-Tin-Oxide electrode material such that the ITO electrode forms a single contiguous layer over both the phase held at a constant D.C. potential and the photocapacitor.

12. The method of claim 9 wherein the step of holding further comprises holding one of the phases at a constant level while applying a third level clock to the other phase to transfer charge from the photocapacitor to the photodetector.

* * * * *